(12) United States Patent
Nieh et al.

(10) Patent No.: US 8,864,954 B2
(45) Date of Patent: Oct. 21, 2014

(54) SPUTTERING LITHIUM-CONTAINING MATERIAL WITH MULTIPLE TARGETS

(75) Inventors: Kai Wei Nieh, Monrovia, CA (US); Jiuh-Ming Liang, Hacienda Heights, CA (US); Victor Krasnov, Tarzana, CA (US)

(73) Assignee: Front Edge Technology Inc., Baldwin Park, CA (US)

( * ) Notice: Subject to any disclaimer, the term of this patent is extended or adjusted under 35 U.S.C. 154(b) by 0 days.

(21) Appl. No.: 13/337,031

(22) Filed: Dec. 23, 2011

(65) Prior Publication Data

US 2013/0164459 A1    Jun. 27, 2013

(51) Int. Cl.
*C23C 14/00* (2006.01)
*C23C 14/32* (2006.01)

(52) U.S. Cl.
USPC ............... 204/192.13; 204/192.15; 204/192.1

(58) Field of Classification Search
USPC .............................. 204/192.1, 192.13, 192.15
See application file for complete search history.

(56) References Cited

U.S. PATENT DOCUMENTS

| | | |
|---|---|---|
| 3,375,135 A | 3/1968 | Moulton et al. |
| 3,414,685 A | 12/1968 | Geib et al. |
| 3,530,007 A | 9/1970 | Golubovic |
| 3,844,841 A | 10/1974 | Baker |
| 3,969,142 A | 7/1976 | Greatbatch et al. |
| 3,993,508 A | 11/1976 | Erlichman |
| 4,031,449 A | 6/1977 | Trombly |
| 4,119,769 A | 10/1978 | Schneider et al. |
| 4,233,371 A | 11/1980 | Dorrestijn |
| 4,279,726 A | 7/1981 | Baird et al. |
| 4,309,494 A | 1/1982 | Stockel |
| 4,421,835 A | 12/1983 | Manassen et al. |
| 4,459,328 A | 7/1984 | Mizuhara |
| 4,543,441 A | 9/1985 | Kumada et al. |
| 4,565,753 A | 1/1986 | Goebel et al. |
| 4,597,844 A | 7/1986 | Hiraki et al. |
| 4,619,865 A | 10/1986 | Keem et al. |

(Continued)

FOREIGN PATENT DOCUMENTS

| | | |
|---|---|---|
| CN | 1661354 A | 8/2005 |
| EP | 0 829 913 A | 3/1998 |

(Continued)

OTHER PUBLICATIONS

Antaya et al. "Preparation and Characterization of LiCoO2 Thin Films by Laser Ablation Deposition", J. Electrochem. Soc., vol. 140, No. 3, Mar. 1993, pp. 575-578.

(Continued)

*Primary Examiner* — Keith Hendricks
*Assistant Examiner* — Ibrahime A Abraham
(74) *Attorney, Agent, or Firm* — Ashok K. Janah; Janah & Associates, PC.

(57) ABSTRACT

A method of depositing lithium-containing films on a battery substrate in a sputtering chamber is provided. At least one pair of sputtering targets that each comprise a lithium-containing sputtering member is provided in the sputtering chamber, the sputtering targets selected to each have a conductivity of at least about $5 \times 10^{-6}$ S·cm$^{-1}$. A substrate carrier holding at least one battery substrate is placed in the sputtering chamber. A pressure of sputtering gas is maintained in the sputtering chamber. The sputtering gas is energized by applying to the pair of sputtering targets, an electrical power at a frequency of from about 10 to about 100 kHz.

21 Claims, 7 Drawing Sheets

(56) References Cited

U.S. PATENT DOCUMENTS

| | | | |
|---|---|---|---|
| 4,663,183 | A | 5/1987 | Ovshinsky et al. |
| 4,698,256 | A | 10/1987 | Giglia et al. |
| 4,714,660 | A | 12/1987 | Gates, Jr. |
| 4,725,345 | A | 2/1988 | Sakamoto et al. |
| 4,777,090 | A | 10/1988 | Ovshinsky et al. |
| 4,871,433 | A | 10/1989 | Wagner et al. |
| 4,873,115 | A | 10/1989 | Matsumura et al. |
| 4,877,677 | A | 10/1989 | Hirochi et al. |
| 4,882,212 | A | 11/1989 | SingDeo et al. |
| 4,904,542 | A | 2/1990 | Mroczkowski |
| 4,996,079 | A | 2/1991 | Itoh |
| 5,019,467 | A | 5/1991 | Fujiwara |
| 5,171,413 | A | 12/1992 | Arntz et al. |
| 5,197,889 | A | 3/1993 | Rizzo et al. |
| 5,240,794 | A | 8/1993 | Thackeray et al. |
| 5,249,554 | A | 10/1993 | Tamor et al. |
| 5,250,891 | A | 10/1993 | Glasgow |
| 5,253,300 | A | 10/1993 | Knapp |
| 5,254,415 | A | 10/1993 | Williams et al. |
| 5,262,028 | A | 11/1993 | Manley |
| 5,330,853 | A | 7/1994 | Hofmann et al. |
| 5,338,625 | A | 8/1994 | Bates et al. |
| 5,368,939 | A | 11/1994 | Kawamura et al. |
| 5,445,906 | A * | 8/1995 | Hobson et al. |
| 5,478,456 | A * | 12/1995 | Humpal et al. .......... 204/192.13 |
| 5,490,911 | A | 2/1996 | Makowiecki et al. |
| 5,498,490 | A | 3/1996 | Brodd |
| 5,503,912 | A | 4/1996 | Setoyama et al. |
| 5,506,858 | A | 4/1996 | Takenaka et al. |
| 5,511,587 | A | 4/1996 | Miya et al. |
| 5,512,147 | A | 4/1996 | Bates et al. |
| 5,512,387 | A | 4/1996 | Ovshinsky |
| 5,516,340 | A | 5/1996 | Takeuchi et al. |
| 5,547,767 | A | 8/1996 | Paidassi et al. |
| 5,552,242 | A | 9/1996 | Ovshinsky et al. |
| 5,554,456 | A | 9/1996 | Ovshinsky et al. |
| 5,561,004 | A | 10/1996 | Bates et al. |
| 5,597,660 | A | 1/1997 | Bates et al. |
| 5,607,789 | A | 3/1997 | Treger et al. |
| 5,612,152 | A | 3/1997 | Bates et al. |
| 5,629,560 | A | 5/1997 | Katsui et al. |
| 5,650,243 | A | 7/1997 | Ferment et al. |
| 5,656,364 | A | 8/1997 | Rickerby et al. |
| 5,663,183 | A | 9/1997 | Frost et al. |
| 5,670,252 | A | 9/1997 | Makowiecki et al. |
| 5,670,272 | A | 9/1997 | Cheu et al. |
| 5,681,666 | A | 10/1997 | Treger et al. |
| 5,700,551 | A | 12/1997 | Kukino et al. |
| 5,705,293 | A | 1/1998 | Hobson |
| 5,705,297 | A | 1/1998 | Warren |
| 5,708,297 | A | 1/1998 | Clayton |
| 5,725,909 | A | 3/1998 | Shaw et al. |
| 5,814,159 | A | 6/1998 | Lehan et al. |
| 5,786,582 | A | 7/1998 | Roustaei et al. |
| 5,818,199 | A | 10/1998 | Beard |
| 5,824,374 | A | 10/1998 | Bradley, Jr. et al. |
| 5,871,865 | A | 2/1999 | Barker et al. |
| 5,894,656 | A | 4/1999 | Menon et al. |
| 5,932,368 | A | 8/1999 | Batawi et al. |
| 5,961,672 | A | 10/1999 | Skotheim et al. |
| 5,981,102 | A | 11/1999 | Grigg et al. |
| 5,985,485 | A | 11/1999 | Ovshinsky et al. |
| 6,017,654 | A | 1/2000 | Kumta et al. |
| 6,022,640 | A | 2/2000 | Takada et al. |
| 6,039,850 | A | 3/2000 | Schulz |
| 6,040,680 | A | 3/2000 | Toya et al. |
| 6,046,575 | A | 4/2000 | Demuro |
| 6,051,114 | A | 4/2000 | Yao et al. |
| 6,118,248 | A | 9/2000 | Gartstein et al. |
| 6,146,715 | A | 11/2000 | Kim et al. |
| 6,148,503 | A | 11/2000 | Delnick et al. |
| 6,168,884 | B1 | 1/2001 | Neudecker et al. |
| 6,197,450 | B1 | 3/2001 | Nathan et al. |
| 6,217,623 | B1 | 4/2001 | Reichert et al. |
| 6,218,049 | B1 | 4/2001 | Bates et al. |
| 6,220,765 | B1 | 4/2001 | Tatoh |
| 6,227,204 | B1 | 5/2001 | Baumann et al. |
| 6,238,847 | B1 | 5/2001 | Axtell, III et al. |
| 6,242,129 | B1 | 6/2001 | Johnson |
| 6,264,709 | B1 | 7/2001 | Yoon et al. |
| 6,280,875 | B1 | 8/2001 | Kwak et al. |
| 6,287,711 | B1 | 9/2001 | Nieh et al. |
| 6,340,880 | B1 | 1/2002 | Higashijima et al. |
| 6,365,010 | B1 | 4/2002 | Hollars |
| 6,379,835 | B1 | 4/2002 | Kucherovsky et al. |
| 6,387,039 | B1 | 5/2002 | Moses |
| 6,387,563 | B1 | 5/2002 | Bates |
| 6,398,824 | B1 | 6/2002 | Johnson |
| 6,402,796 | B1 | 6/2002 | Johnson |
| 6,411,780 | B1 | 6/2002 | Maruyama |
| 6,413,645 | B1 | 7/2002 | Graff et al. |
| 6,461,757 | B1 | 10/2002 | Sasayama et al. |
| 6,472,295 | B1 | 10/2002 | Morris et al. |
| 6,517,968 | B2 | 2/2003 | Johnson et al. |
| 6,558,836 | B1 | 5/2003 | Whitacre et al. |
| 6,632,563 | B1 | 10/2003 | Krasnov et al. |
| 6,636,017 | B2 | 10/2003 | Zink et al. |
| 6,645,658 | B2 | 11/2003 | Morozumi |
| 6,658,124 | B1 | 12/2003 | Meadows |
| 6,661,197 | B2 | 12/2003 | Zink et al. |
| 6,696,199 | B2 | 2/2004 | Yoshida et al. |
| 6,700,766 | B2 | 3/2004 | Sato |
| 6,713,987 | B2 | 3/2004 | Krasnov et al. |
| 6,805,998 | B2 | 10/2004 | Jenson et al. |
| 6,863,699 | B1 | 3/2005 | Krasnov et al. |
| 6,866,901 | B2 | 3/2005 | Burrows et al. |
| 6,916,679 | B2 | 7/2005 | Snyder et al. |
| 6,921,464 | B2 | 7/2005 | Krasnov et al. |
| 6,940,988 | B1 | 9/2005 | Shennib et al. |
| 6,982,132 | B1 | 1/2006 | Goldner et al. |
| 7,037,621 | B2 | 5/2006 | Kikuchi et al. |
| 7,056,620 | B2 | 6/2006 | Krasnov et al. |
| 7,122,908 | B2 | 10/2006 | Jiang et al. |
| 7,157,187 | B2 | 1/2007 | Jenson |
| 7,186,479 | B2 | 3/2007 | Krasnov et al. |
| 7,194,801 | B2 | 3/2007 | Jenson et al. |
| 7,194,901 | B2 | 3/2007 | Silverbrook et al. |
| 7,276,878 | B2 | 10/2007 | Phillips et al. |
| 7,286,479 | B2 | 10/2007 | Bragg |
| 7,308,316 | B2 | 12/2007 | Schommer |
| 7,359,590 | B2 | 4/2008 | Hsu |
| 7,397,118 | B2 | 7/2008 | Tominaga |
| 7,510,582 | B2 | 3/2009 | Krasnov et al. |
| 7,524,577 | B2 | 4/2009 | Bates |
| 7,701,176 | B2 | 4/2010 | Chen |
| 7,846,579 | B2 | 12/2010 | Krasnov et al. |
| 7,862,627 | B2 | 1/2011 | Li et al. |
| 7,862,927 | B2 | 1/2011 | Krasnov et al. |
| 8,030,898 | B2 | 10/2011 | Okuto |
| 8,168,322 | B2 | 5/2012 | Krasnov et al. |
| 2001/0007335 | A1 | 7/2001 | Tuttle et al. |
| 2001/0041294 | A1 | 11/2001 | Chu et al. |
| 2001/0052645 | A1 | 12/2001 | Op'T Eynde et al. |
| 2002/0004167 | A1 | 1/2002 | Jenson et al. |
| 2002/0028384 | A1 | 3/2002 | Krasnov et al. |
| 2002/0041930 | A1 | 4/2002 | Erdemir et al. |
| 2002/0071989 | A1 | 6/2002 | Verma et al. |
| 2002/0100989 | A1 | 8/2002 | Jiang et al. |
| 2002/0102400 | A1 | 8/2002 | Gorokhovsky et al. |
| 2002/0110733 | A1 | 8/2002 | Johnson |
| 2002/0150823 | A1 | 10/2002 | Breitkopf et al. |
| 2003/0121142 | A1 | 7/2003 | Kikuchi et al. |
| 2003/0143460 | A1 | 7/2003 | Yoshida et al. |
| 2003/0152829 | A1 | 8/2003 | Zhang et al. |
| 2003/0160589 | A1 | 8/2003 | Krasnov et al. |
| 2004/0018424 | A1 | 1/2004 | Zhang et al. |
| 2004/0064937 | A1 | 4/2004 | Krasnov et al. |
| 2004/0086762 | A1 | 5/2004 | Maeda et al. |
| 2004/0175609 | A1 | 9/2004 | Yageta et al. |
| 2005/0079418 | A1 | 4/2005 | Kelley et al. |
| 2005/0112461 | A1 | 5/2005 | Amine et al. |
| 2005/0130032 | A1 | 6/2005 | Krasnov et al. |
| 2005/0147877 | A1 | 7/2005 | Tarnowski et al. |
| 2005/0156573 | A1 | 7/2005 | Lin |

(56) References Cited

U.S. PATENT DOCUMENTS

| | | |
|---|---|---|
| 2005/0275370 A1 | 12/2005 | Kim |
| 2006/0027937 A1 | 2/2006 | Benson et al. |
| 2006/0040169 A1 | 2/2006 | Liu et al. |
| 2006/0040170 A1 | 2/2006 | Liu et al. |
| 2006/0060956 A1 | 3/2006 | Tanikella |
| 2006/0068258 A1 | 3/2006 | Kinoshita |
| 2006/0115706 A1 | 6/2006 | Maeda et al. |
| 2006/0134522 A1 | 6/2006 | Zhang et al. |
| 2006/0152196 A1 | 7/2006 | Matsumoto et al. |
| 2006/0216589 A1 | 9/2006 | Krasnov et al. |
| 2006/0226812 A1 | 10/2006 | Patino et al. |
| 2006/0267546 A1 | 11/2006 | Shen et al. |
| 2007/0000688 A1 | 1/2007 | Mobley |
| 2007/0037054 A1 | 2/2007 | Kikuchi et al. |
| 2007/0047750 A1 | 3/2007 | Sauer et al. |
| 2007/0104343 A1 | 5/2007 | Bengtsson et al. |
| 2007/0104344 A1 | 5/2007 | Goldberg |
| 2007/0125638 A1* | 6/2007 | Zhang et al. ............ 204/192.15 |
| 2007/0141460 A1 | 6/2007 | You et al. |
| 2007/0166612 A1 | 7/2007 | Krasnov et al. |
| 2007/0172739 A1 | 7/2007 | Visco et al. |
| 2007/0200258 A1 | 8/2007 | Mahler et al. |
| 2007/0297108 A1 | 12/2007 | Collins et al. |
| 2008/0003492 A1 | 1/2008 | Bates |
| 2008/0087986 A1 | 4/2008 | Tanikella |
| 2008/0191342 A1 | 8/2008 | Otremba |
| 2008/0213664 A1 | 9/2008 | Krasnov et al. |
| 2008/0217162 A1 | 9/2008 | Delrue et al. |
| 2008/0253098 A1 | 10/2008 | Liu |
| 2008/0263855 A1 | 10/2008 | Li et al. |
| 2008/0290363 A1 | 11/2008 | Lin et al. |
| 2008/0303056 A1 | 12/2008 | Ward et al. |
| 2008/0308935 A1 | 12/2008 | Kim et al. |
| 2009/0010462 A1 | 1/2009 | Ekchian et al. |
| 2009/0029500 A1 | 1/2009 | Wan |
| 2009/0039498 A1 | 2/2009 | Bayerer |
| 2009/0057136 A1 | 3/2009 | Wang et al. |
| 2009/0114429 A1 | 5/2009 | Sri-Jayantha et al. |
| 2009/0115051 A1 | 5/2009 | Leung et al. |
| 2009/0136839 A1 | 5/2009 | Krasnov et al. |
| 2009/0159433 A1 | 6/2009 | Neudecker et al. |
| 2009/0208671 A1 | 8/2009 | Nieh et al. |
| 2010/0247987 A1 | 9/2010 | Holung et al. |
| 2010/0264017 A1 | 10/2010 | Nam et al. |
| 2010/0291431 A1 | 11/2010 | Shih et al. |
| 2011/0050159 A1 | 3/2011 | Nieh et al. |
| 2011/0076550 A1 | 3/2011 | Liang et al. |
| 2011/0094094 A1 | 4/2011 | Li et al. |
| 2011/0273809 A1 | 11/2011 | Falsett et al. |
| 2012/0003520 A1 | 1/2012 | Lee et al. |
| 2012/0034502 A1 | 2/2012 | Nieh et al. |
| 2012/0080940 A1 | 4/2012 | Larsen |
| 2012/0251867 A1 | 10/2012 | Krasnov et al. |
| 2012/0268057 A1 | 10/2012 | Wu |

FOREIGN PATENT DOCUMENTS

| | | | |
|---|---|---|---|
| EP | 1 353 429 A | 10/2003 | |
| EP | 1 458 037 A | 9/2004 | |
| FR | 2 403 652 A | 4/1979 | |
| GB | 2251119 A | 6/1992 | |
| JP | 59-032023 A | 2/1984 | |
| JP | 59-226472 A | 12/1984 | |
| JP | 60-072168 | 4/1985 | |
| JP | 61195563 A | 8/1986 | |
| JP | 04-295015 | 10/1992 | |
| JP | 09-259929 A | 10/1997 | |
| JP | 2001-044073 A | 2/2001 | |
| JP | 2002-165358 | 6/2002 | |
| JP | 2002-313289 | 10/2002 | |
| JP | 2003-249199 A | 9/2003 | |
| WO | WO-95/14311 A | 5/1995 | |
| WO | WO-98/08672 A1 | 3/1998 | |
| WO | WO-99/23714 | 5/1999 | |
| WO | WO-99/52589 A1 | 10/1999 | |
| WO | WO-00/60689 A | 10/2000 | |
| WO | WO-01/73873 A | 10/2001 | |
| WO | WO-02/061828 A2 | 8/2002 | |
| WO | WO-02/21627 A3 | 1/2003 | |
| WO | WO-02/42516 A3 | 1/2003 | |
| WO | WO-03/061049 A | 7/2003 | |
| WO | WO-03/073531 A3 | 12/2003 | |
| WO | WO-03/005477 A3 | 12/2004 | |
| WO | WO-2004/111659 A2 | 12/2004 | |
| WO | WO-2006/042357 A1 | 4/2006 | |
| WO | WO-2006/105188 A1 | 10/2006 | |
| WO | WO-2006/105050 A3 | 3/2007 | |
| WO | WO-2007/042394 | 4/2007 | |
| WO | WO-2008/004851 A1 | 1/2008 | |
| WO | WO 2008101254 A2 * | 8/2008 | .............. H01J 37/34 |
| WO | WO-2008/108999 A3 | 11/2008 | |
| WO | WO-2008/134053 A1 | 11/2008 | |
| WO | WO-2009/052683 A1 | 4/2009 | |
| WO | WO-2009/073150 | 6/2009 | |

OTHER PUBLICATIONS

Fragnaud et al. "Characterization of sprayed and sputter deposited LiCoO2 thin films for rechargeable microbatteries", J. Power Sources, 63 (1996), pp. 187-191.

Birke et al. "Materials for lithium thin-film batteries for application in silicon technology", Solid State Ionics, 93 (1997), pp. 1-15.

Benqlilou-Moudden et al. "Amorphous Lithium Cobalt and Nickel Oxides Thin Films Preparation and Characterization by RBS and PIGE", Thin Solid Films 333 (1998), pp. 16-19.

Yang et al., "Effect of annealing temperature on structure and electrochemical properties of LiCoO2 cathode thin films", Rare Metals, vol. 25, Dec. 2006, pp. 189-192.

PCT International Search Report in Application No. PCT/US2008/013213 (WO 2009/073150 A1), mailed Jun. 18, 2009.

Mattox, Donald M., Handbook of Physical Vapor Deposition (PVD) Processing, Film Formation, Adhesion, Surface Preparation and Contamination Control, 1998, pp. 127-135 and 343-364, Noyes Publications, Westwood, New Jersey, USA.

Non-Final Office Action dated Sep. 17, 2010 in U.S. Appl. No. 11/849,959, filed Sep. 4, 2007.

Final Office Action dated Feb. 15, 2010 in U.S. Appl. No. 11/849,959, filed Sep. 4, 2007.

Non-Final Office Action dated Aug. 13, 2012 in U.S. Appl. No. 11/849,959, filed Sep. 4, 2007.

Roh et al., "Effects of deposition condition on the ionic conductivity . . . " Scripta Materialia, Dec. 17, 1999, pp. 43-49, vol. 42. No. 1, New York, NY.

Bolster et al., "Investigation of lithium intercalation metal oxides for thermalbatteries" Proceedings of the 34th Int'l Power Source Symposium, Jun. 25-28, 1990, pp. 136-140.

Liang et al., U.S. Appl. No. 13/278,082, filed Oct. 20, 2011, for Thin Film Battery Packaging Formed by Localized Heating.

Nieh et al., U.S. Appl. No. 13/627,977, filed Sep. 26, 2012, for Plasma Deposition on a Partially Formed Battery Through a Mesh Screen.

Shih et al., U.S. Appl. No. 13/626,842, filed Sep. 25, 2012, for Solid State Battery Having Mismatched Cells.

Liang, Jiuh-Ming, U.S. Appl. No. 13/434,775, filed Mar. 29, 2012, for Localized Heat Treatment of Battery Component Films.

Shih et al., U.S. Appl. No. 13/333,969, filed Dec. 21, 2011, for Laminated Lithium Battery.

Shih et al., U.S. Appl. No. 13/652,416, filed Oct. 15, 2012, for Lithium Battery Having Low Leakage Anode.

PCT International Search Report in Application No. PCT/US2011/046674 dated Feb. 17, 2012.

Bates et al., "Preferred orientation of polycrystalline LiCoO2 films" J. of the Electrochemical Society (2000), pp. 59-70, Issue No. 147 (1).

Wagner et al., "Fabrication and Testing of thermoelectric thin film devices" 15th Int'l Conf. on Thermoelectrics, Mar. 26-29, 1996, pp. 269-273.

Neudecker et al., "Lithium-Free Thin-Film Battery . . . " Journal of the Electrochemical Society (2000), pp. 517-523, Issue No. 147 (2).

(56) References Cited

OTHER PUBLICATIONS

Park et al., "Characterization of tin oxide/LiMn2O4 thin-film cell," Journal of Power Sources, Jun. 2000, pp. 250-254, vol. 88, No. 2, Elsevier Science S.A.

PCT International Preliminary Report on Patentability, Application No. PCT/US2008/013213 (WO09/073150), Mailed Jun. 10, 2010.
PCT International Search Report in Application No. PCT/US2012/063100, mailed Feb. 28, 2013.

* cited by examiner

SPUTTERING LITHIUM-CONTAINING MATERIAL WITH MULTIPLE TARGETS

BACKGROUND

Rechargeable batteries such as solid state and thin film batteries are used to supply stored energy in many applications, including portable electronics, automotive and cordless tool applications, medical devices, and even space systems. Thin film batteries are solid state batteries (absent liquid electrolytes) having thin films with thicknesses of less than 100 microns. Thin film batteries are used in applications requiring a small size, high specific energy or density, and resistance to environmental degradation. Both solid state and thin film batteries can have battery component films comprising lithium-containing compounds that can include one or more of a current collector, cathode, anode and electrolyte, and which cooperate to store energy. The lithium-containing films are formed on the substrate by conventional fabrication processes, such as for example, physical or chemical vapor deposition (PVD or CVD), oxidation, nitridation, electron beam evaporation, and electroplating processes.

In lithium batteries, some of the battery component films are composed of lithium-containing material, such as lithium metal oxide or other lithium-containing compounds. For example, the cathode can be composed of a lithium-containing material such as $LiCoO_x$. Increasing the thickness of the lithium oxide cathode film increases the energy density of the battery as the thicker cathode film provides greater charge retention and faster charging and discharging. For example, specific energy levels of at least 250 Whr/L can be achieved using a sputtered cathode film having a thickness of 5 microns or higher, as for example, taught in commonly assigned U.S. patent application Ser. No. 11/007,362 entitled "THIN FILM BATTERY AND METHOD OF MANUFACTURE" which is incorporated by reference herein in its entirety. The lithium oxide cathode film can be deposited as an amorphous or microcrystalline film in a sputtering process, and thereafter, crystallized by heating the film; or deposited in a sequence of thin films to form a thicker cathode comprising a stack of films.

However, conventional lithium oxide sputtering processes have several limitations, which include relatively slow film deposition rates that make it economically difficult to manufacture thick cathode films. For example, conventional radio frequency magnetron sputtering processes often result in deposition rates of around 0.2 microns per hour. Increasing the sputter deposition rates can result in plasma arcing which affects the quality of deposited films. Multiple target sputtering processes have been developed to increase deposition rates to achieve thicker cathode layers as for example described in commonly assigned U.S. patent application Ser. No. 11/849,959, filed: September 4, entitled "MANUFACTURING METHOD FOR THIN FILM BATTERY" which is incorporated herein by reference in its entirety. However, even these processes have difficulties as the sputtering properties of different, individual targets often do not match one another resulting in non-uniform deposition across the area of the substrate.

For various reasons that include these and other deficiencies, and despite the development of various battery fabrication methods, further improvements in the sputtering of lithium-containing materials for battery fabrication and related apparatus are continuously being sought.

SUMMARY

A method of depositing lithium-containing films on a battery substrate in a sputtering chamber, comprises providing in the sputtering chamber, at least one pair of sputtering targets that each comprise a lithium-containing sputtering member, the sputtering targets selected to each have a conductivity of at least about $5 \times 10^{-6}$ S·cm$^{-1}$. A substrate carrier holding at least one battery substrate is placed in the sputtering chamber. A pressure of sputtering gas is maintained in the sputtering chamber. The sputtering gas is energized by applying to the pair of sputtering targets, an electrical power at a frequency of from about 10 to about 100 kHz.

A method of depositing lithium-containing films on a battery substrate in a sputtering chamber, comprises providing in the sputtering chamber, first and second sputtering targets that each comprise a lithium-containing sputtering member. A substrate carrier holding at least one battery substrate is placed in the sputtering chamber. A pressure of sputtering gas is maintained in the sputtering chamber. The impedance of the first sputtering target is adjusted to be within a range that is ±10% of the impedance of the second sputtering target. The sputtering gas is energized by applying to the first and second sputtering targets, an electrical power at a frequency of from about 10 to about 100 kHz.

A sputtering apparatus for depositing lithium-containing films on a battery substrate, the apparatus comprising a sputtering chamber comprising at least one pair of sputtering targets mounted in the chamber, each sputtering targets comprising a lithium-containing sputtering member and a backing plate; a substrate carrier holding at least one battery substrate; a gas distributor for introducing a sputtering gas into the sputtering chamber; and an exhaust for maintaining a pressure of the sputtering gas in the sputtering chamber. A target power source comprises (i) an impedance matching circuit for adjusting the impedance of at least one of the pair of sputtering targets so that the impedance of that sputtering target is within a range that is ±10% of the impedance of the other sputtering target; and (ii) at least one power supply to apply to the pair of sputtering targets, an electrical power at a frequency of from about 10 to about 100 kHz.

A kit of a plurality of sputtering targets, wherein each sputtering target comprises a conductivity of at least about $5 \times 10^{-6}$ S·cm$^{-1}$, a backing plate having a back surface, and a lithium-containing sputtering member having a front surface.

DRAWINGS

The features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 2A1 is a partial perspective view of a sputtering target comprising segments having a wedge interface;

DESCRIPTION

Figure 1A:
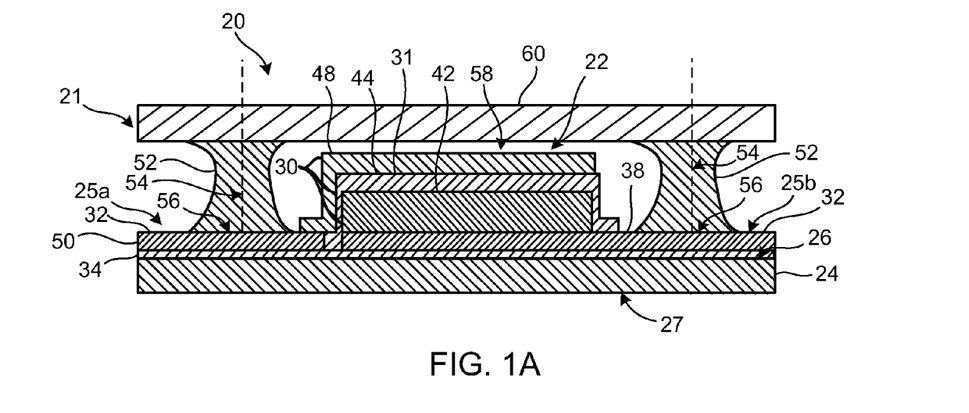
FIG. 1A is a sectional side view of an embodiment of a lithium battery comprising a battery cell on a substrate.
Figure 1B:
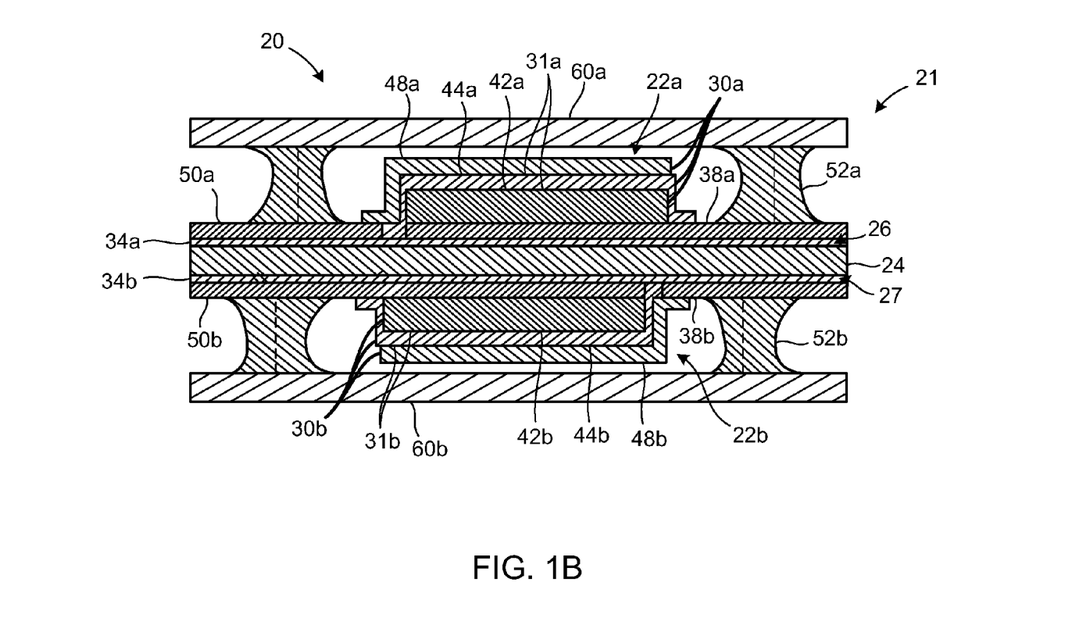
FIG. 1B is a sectional side view of another embodiment of a lithium battery comprising a first battery cell on a first surface of a substrate and a second battery cell on a second surface of the same substrate.

Exemplary embodiments of a rechargeable battery 20 having a protective casing 21 enclosing one or more battery cells 22 or 22a,b, which are fabricated using a process and apparatus according to the present invention, are shown in FIGS. 1A and 1B. The protective casing 21 protects the battery cell 22 from degradation in the external environment. The substrate 24 comprises a material that is impermeable, or has very low permeability, to environmental elements such as oxygen, water vapor, carbon monoxide and carbon dioxide. The substrate 24 should also have a relatively smooth surface and sufficient strength to support sets of battery component films 30 that form each battery cell 22, at the fabrication and operational temperatures of the battery component films. For example, the substrate 24 can comprise aluminum, aluminum oxide, metal foil, metalized plastic film, mica, quartz, or steel. In one version, the substrate 24 comprises a first surface 26 and a second surface 27 both of which are planar, or even flat and smooth. One desirable type of substrate 24 comprises a crystalline sheet formed by cleaving the planes of a cleavable crystalline structure, such as mica or graphite. The exemplary versions of the battery 20 illustrated herein are provided to demonstrate features of the battery and illustrate processes of fabrication; however, it should be understood that these exemplary battery structures should not be used to limit the scope of the invention, and alternative battery structures as would be apparent to those of ordinary skill in the art are within the scope of the present invention.

The battery cell 22 includes battery component films 30 that cooperate to form a battery capable of receiving, storing, and discharging electrical energy. The battery component films 30 include one or more lithium-containing films 31. The battery component films 30 are formed on an adhesion layer 34 which is deposited on the first surface 26 of the battery substrate 24. The battery component films 30 include at least a pair of electrodes 32 on either side of an electrolyte 44. The electrodes 32 can include one or more of a cathode current collector 38, cathode 42, anode 48, and anode current collector 50, which are all interchangeable and can be designed to replace one another. The protective casing 21 can include a polymer 52 covering one or more of the side perimeter surfaces 54 that extend along the perimeter 56 of the battery 20, as well as the first surface 58 of the battery 20. The casing 21 can also include a cover 60 which covers the first surface 58 of the battery 20. Suitable battery cell 22 configurations and protective casings 21, are described in, for example, US Patent Publication No. 20100291431A1, filed on Mar. 13, 2009, entitled "THIN FILM BATTERY WITH PROTECTIVE PACKAGING" by Shih et al.; US Patent Publication No. 20110076550A1, filed on Dec. 8, 2010, entitled "BATTERY WITH PROTECTIVE PACKAGING" by Liang et al.; and U.S. Pat. No. 7,846,579, filed on Mar. 25, 2005, entitled "Thin Film Battery with Protective Packaging" to Krasnov et al., all of which are all incorporated by reference herein and in their entireties.

In the version shown in FIG. 1B, the battery 20 comprises a first battery cell 22a on an adhesion layer 34a deposited on the first surface 26 of the substrate 24 and a second battery cell 22b on an adhesion layer 34b on the second surface 27 of the substrate 24. While single battery cells 22a,b are shown, it should be understood that more than one battery cell 22a or 22b can be arranged horizontally across the top or second surfaces 26, 27, respectively, of the battery substrate 24. Each battery cell 22a,b comprises a plurality of battery component films 30a,b that include an adhesion layer 34a,b; cathode current collector 38a,b; cathode 42a,b; electrolyte 44a,b; anode 48a,b; and second or anode current collector 50a,b, respectively. This version of the battery 20 having two opposing cells 22a,b can be formed using the same processes used to form the battery 20 with the single cell 22 shown in FIG. 1A, by flipping over the substrate 24 to form the battery film components 30b of the second battery cell 22b, during or after processing of the first battery cell 30a. Alternatively, the battery film components 30b of the second battery cell 22b can be formed simultaneously with the battery film components 30a of cell 22a, using a sputtering chamber having multiple sputtering targets on either side of the battery substrate 24. In this battery 20, the protective casing 21 includes two layers or beads of polymer 52a,b covering the two battery cells 22a,b, respectively, as well as two covers 60a,b.

Figure 2A:
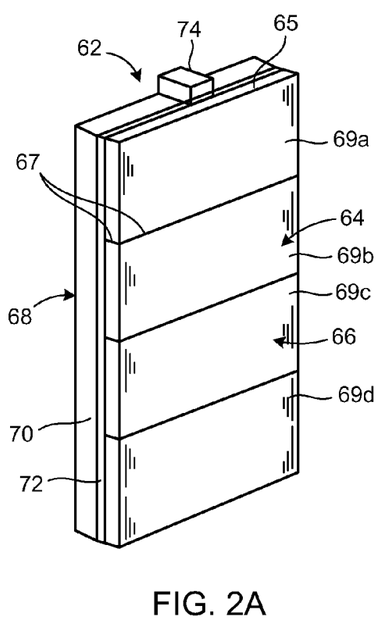
FIG. 2A is a perspective view of an embodiment of a sputtering target comprising a rectangular plate.
Figure 2A:
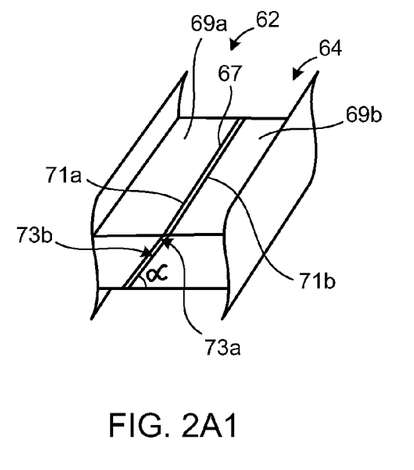
Figure 2B:
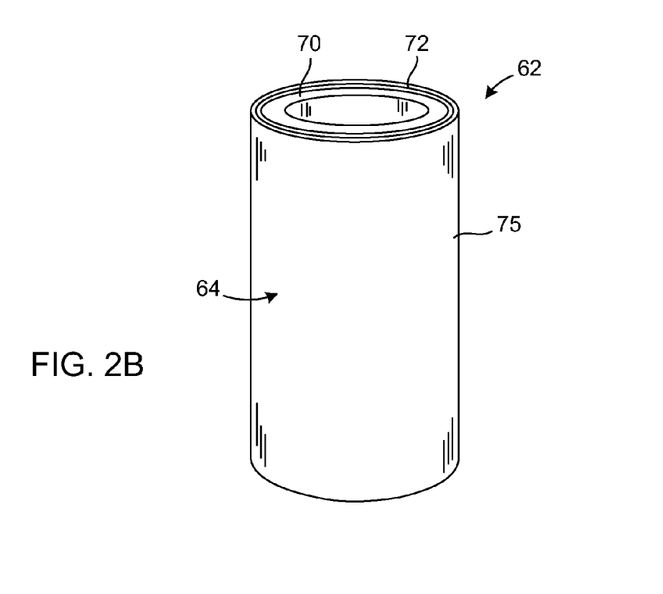
FIG. 2B is a perspective view of an embodiment of a sputtering target comprising a cylinder.

The lithium-containing films 31 or 31a,b that form some of the battery component films 30 of each battery cell 22, are deposited onto a battery substrate 24 by sputtering a plurality of sputtering targets 62. Exemplary embodiments of the sputtering targets 62 are shown in FIGS. 2A and 2B. The sputtering targets 62 each comprise a lithium-containing sputtering member 64 composed of a lithium-containing material that is to be sputtered off. For example, the lithium-containing sputtering member can be composed of a lithium compound, such as for example, lithium oxide or other lithium compounds. The lithium-containing sputtering member can also be composed lithium-containing material with one or more other metals, for example, a lithium metal compound such as lithium metal oxide, where the "metal" is any transition metal element other than the lithium. For example, the lithium metal oxide can be lithium cobalt oxide or lithium nickel cobalt oxide. In one version, the lithium-containing sputtering member 64 is composed of lithium cobalt oxide having a stochiometric formula that is $LiCoO_2$. The sputtering member 64 comprising lithium cobalt oxide is used to deposit battery component films 30 which are lithium-containing films 31 or 31a,b, such as lithium cobalt oxide films, onto battery substrates 24.

The lithium-containing sputtering member 64 can be rectangular, circular or cylindrical, in shape depending on the shape of the chamber 100 in which the targets 62 mounted or the shape of the battery substrate 24 on which material is to be sputtered. An exemplary embodiment of a lithium-containing sputtering member 64 comprises a rectangular plate 65 having a front surface 66 and a back surface 68, as shown in FIG. 2A. The multiple segments 69a-d, can be for example, from about two to about ten segments, or even from about four (as shown) to about six segments, which may be equally sized or have different sizes. The rectangular plate 65 can have a thickness of at least about 0.6 cm, or even from about 0.4 cm to about 1 cm. In one version, the sputtering member 64 and the rectangular plate 65 each have a length of from about 25 to about 120 cm, for example about 64 cm; a width of from about 10 to about 50 cm, or even about 12 cm; and/or a thickness of from about 0.4 cm to about 1 cm, or even about 0.6 cm.

The segments 69a-d allow fabrication of a larger scale target used in many battery fabrication apparatus. As target technology develops, however, fewer or even a single segment may be used. Further, in the version shown in FIG. 2A, the rectangular plate 65 is composed of multiple segments 69a-d that abut one another at an interface 67 that is flat. However, the sputtering target 62 can also have segments 69a-d that abut one another with an interface 67 comprising overlapping wedges 71a,b, as shown in FIG. 2A1. The wedges 71a,b of the segments 69a,b respectively, can each have an angled face 73 that is inclined at an angle (alpha) of from about 15 to about 60 degrees, such as 45 degrees. The wedges 71a,b can reduce sputtering of underlying plates below the sputtering member 64.

The sputtering target 62 also has a backing support 70 which is attached to the sputtering member 64 by an adhesion layer 72. The backing support 70 is provided to support the sputtering member 64 in the sputtering chamber. Both the backing support 70 and the adhesion layer 72 are generally electrically and thermally conductive. The backing support 70 can be made from a metal, such as copper. The backing support 70 can also have a thickness of from about 0.4 cm to about 0.6 cm. The adhesion layer 72 can be composed of indium (In) or epoxy filled with particles of silver (Ag). The adhesion layer 72 can be made from pure indium, and have a thickness of from about 0.03 cm to about 0.1 cm.

When the sputtering member 64 is rectangular in shape, the backing support 70 is also rectangular, as shown in FIG. 2A. However, the backing support 70 does not have to match the shape of the sputtering member 64. The backing support 70 can also have a fastener 74 to fasten the sputtering target 62 in or to a chamber 100. Suitable fasteners 74 can include hooks, clips, holes and nuts and bolts or clamps, and are made from stainless steel.

In another version, as shown in FIG. 2B, the sputtering target 62 comprises a sputtering member 64 that is a cylinder 75. In this version, the cylinder 75 is a right angled cylinder. The cylinder 75 can have a thickness of at least about 1 mm, or even from about 1 mm to about 5 mm. The cylinder can be a single cylindrical form (as shown) or can be made from segments (not shown). When the sputtering member 64 is cylindrical in shape, the backing support 70 is also cylindrical in shape. An adhesive layer 72 similar to the one described above can be used to join the cylinder 75 off the sputtering member 64 to the cylindrical shaped backing 70.

In one aspect of the present invention, a plurality of sputtering targets 62 are selected such that the targets 62 have particular predefined electrical properties that enhance deposition of lithium-containing films 31 on a plurality of substrates 24 in a sputtering chamber 100. The number of sputtering targets 62 used in a sputtering chamber 100 depends upon the size or volume of the chamber 100, which in turn depends upon the number of substrates 24 being processed. When the sputtering targets are electrically coupled in pairs, the number of sputtering targets 62, can be, for example, an even number, such as for example 2, 4, 6 or 10.

In one version, a group of sputtering targets 62 is selected such that the targets 60 each have an electrical conductivity of at least about $5\times10^{-6}$ S·cm$^{-1}$. If the electrical conductivity is too low, it is more difficult to generate or maintain a stable plasma for sputtering using direct current (DC) power or using a low to mid frequency alternating current (AC) power. Generally, a high-frequency AC power is used for sputtering low-conductivity and dielectric materials, for example, AC power at frequencies exceeding 13 MHz. A deposition system for operating multiple sputtering sources at the same time at these high frequencies is more expansive and more difficult to operate because the multiple high frequency RF power supplies need to be synchronized in phase. In addition, the deposition rate is lower when using high frequency AC sputtering. Still further, the quality of the deposited sputtered film is not as good as low as mid-frequency sputter-deposited films.

In one aspect of the present invention, it has been discovered that a plurality of sputtering targets 62 that are simultaneously sputtered in a single sputtering plasma can be sputtered at lower frequencies, for example at frequencies that are less than 100 KHz—when the group of sputtering targets 62 are selected or fabricated to have a generally higher electrical conductivity of at least about $5\times10^{-6}$ S·cm$^{-1}$. Sputtering targets at these conductivity levels when sputtered at the lower frequencies provide higher deposition rates and the resultant sputtered films have better electrochemical properties. It is believed that the electrical conductivity of the sputtering targets 62 are dependent upon a variety of factors, including the composition of the lithium-containing material, grain size, ratio of grain to grain boundary area, and the composition of the grain boundaries. Thus the electrical conductivity of the sputtering targets 62 can vary depending on the processing conditions used to form the sputtering targets. Sputtering targets 62 that have a conductivity of at least about $5\times10^{-6}$ S·cm$^{-1}$, allow sputtering at lower frequencies with good deposition rates and film properties. In one version, the sputtering targets 62 are selected to have a conductivity of from $5\times10^{-6}$ S·cm$^{-1}$ to about to about $5\times10^{-5}$ S·cm$^{-1}$. In one version, the sputtering targets 62 having these conductivity levels comprise a sputtering member 64 that is composed of a lithium metal oxide, such as lithium cobalt oxide. A set of the selected sputtering targets 62 having the desired conductivity or average conductivity or variance in conductivity, can be made or used as a kit of sputtering targets, in which each sputtering target comprises a conductivity or average conductivity of at least about $5\times10^{-6}$ S·cm$^{-1}$.

In the same version or in an independently operable version, the group of sputtering targets 62 can also be preselected for a single sputtering process such that all the sputtering targets 62 have an electrical conductivity that is sufficiently uniform across their front surfaces 66 to provide a uniform deposition rate over the entire deposition area, and to provide a uniform target consumption. For example, the sputtering targets 62 can be selected so that their electrical conductivity as measured at different regions or points on their surfaces, varies by less than about ±10% or even less than about ±5%, across the front surfaces 66 of the targets 62. The sputtering targets 62 with better and more uniform conductivities provide more uniform deposition rate and consistent film quality. It can also be desirable to have a uniform conductivity over the entire surface of each sputtering target 62 to ensure uniform sputtering from the entire surface area of the sputtering target. If portions of the surface of the sputtering target have lower conductivity, these portions are sputtered less and the corresponding deposition area will have a lower deposition rates and even differing film properties.

The electrical conductivity measured for each sputtering target 62 can also be measured at different regions across the surface area 66 of each sputtering target 62 to determine an average electrical conductivity, or the uniformity or variance of electrical conductivity across the target surface 66 of each target 62. This data can be used to select a pair of sputtering targets 62 such that the average electrical conductivity of each of the two sputtering targets varies by less than about 10%.

The electrical conductivity of the sputtering targets 62, their average electrical conductivity or the variance in electrical conductivity between different targets 62 or pairs of targets 62, can be measured by many well known conductivity or resistivity measurement methods. In one example, a four-point-probe measurement test is applied with a conventional conductivity measurement method using a Jandel four-point-probe tester, manufactured by Bridge Technology, AZ, USA.

In another example, the electrical conductivity of the targets 62 can also be determined using a two probe test conducted with a two probe ohm meter by measuring the resistance across the front surface 66 of the targets 62 (which is the exposed surface of the lithium-containing sputtering members 64) and the back surfaces 68 of the targets 62 (which is the exposed surface of the backing plates 70). In one example, a plate made of an electrically conducting material such as copper which has a well defined surface area—for example, an area of 1 cm2—is placed on the target surface 66. The conducting plate is used to make good electrical contact with the target surface and to better define the measurement area. A flexible conductive material, such as a conductive rubber, can be placed between the conductive plate and the target surface to further improve the electrical contact between the conductive plate and the target surface.

For example, an ohm meter (e.g. Model 2100 multi-meter manufactured by Kethley Inc., Ohio, USA) can be used by positioning a first probe on the conducting copper plate which is placed in direct contact with the front surface 66 of the target 62, and the second probe in contact with the backing plate 70.

In this version, which can be used in combination with the previously described selection methods or independently, each pair of the plurality of sputtering targets 62 is selected such that the average electrical conductivity of each of the sputtering targets 62 of a single pair of targets 62 or all of the targets 62, vary by less than about 10%, or even by less than about 5%. For example, the conductivity of the members of a selected group of sputtering targets 62 can be all from about $5 \times 10^{-6}$ S·cm$^{-1}$ to about $5 \times 10^{-5}$ S·cm$^{-1}$, or even from about $1 \times 10^{-5}$ S·cm$^{-1}$ to about $5 \times 10^{-5}$ S·cm$^{-1}$. As one example, when a first target 62 is measured to have a first electrical conductivity, a second target 62 having a substantially matching second electrical conductivity is selected such that the second electrical conductivity is within a range that is about ±10% of the first conductivity.

Figure 3A:
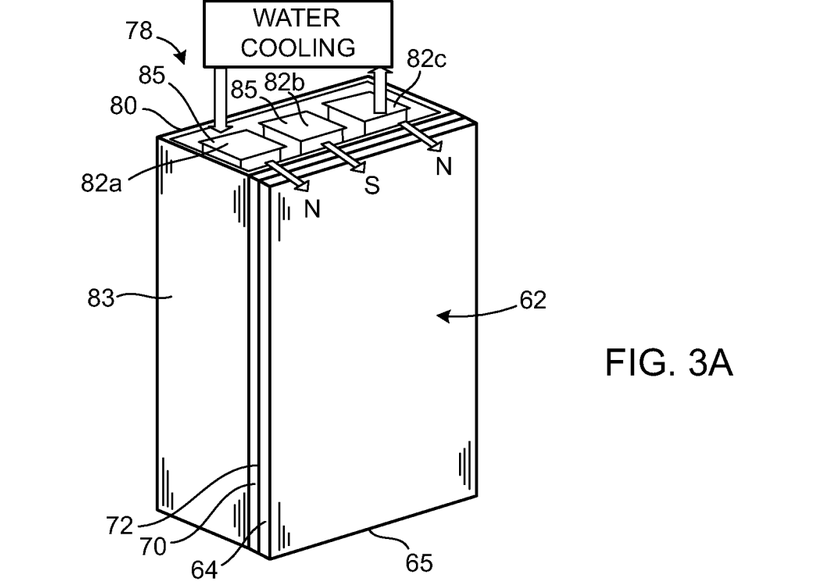
FIG. 3A is a perspective, partially opened, view of a sputtering target comprising a rectangular plate mounted on a magnetron comprising a housing that is rectangular.
Figure 3B:
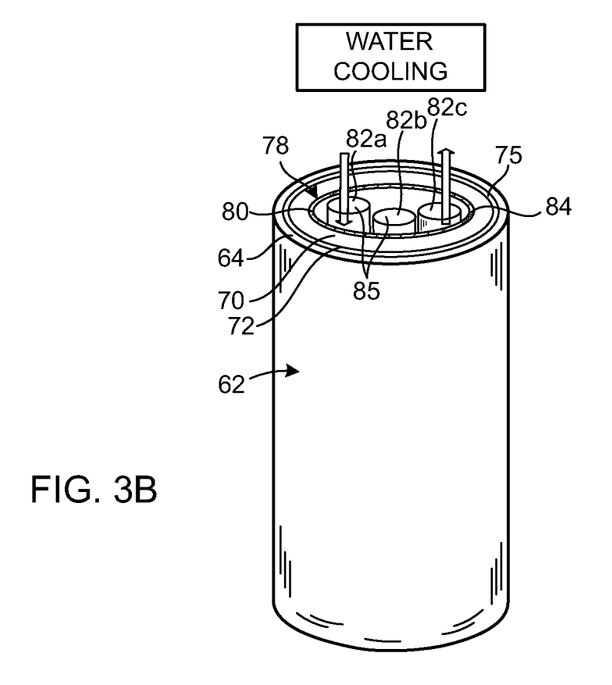
FIG. 3B is a perspective, partially opened, view of a sputtering target comprising a cylinder mounted over a magnetron comprising a housing that is also cylindrical.

In use, each sputtering target 62 is positioned abutting a magnetron 78, as shown in FIGS. 3A and 3B, which generates a magnetic field about the surface of each of the sputtering targets 62 to provide a more uniform and continuous bombardment of the targets 62 with sputtering plasma ions during the sputtering process. The magnetrons 78 can be internally mounted, that is the whole magnetrons are located inside the chamber 100, or the magnetrons 78 can be externally mounted on a chamber wall with the targets 62 inside the chamber 100 and a portion or all of the magnetron housing 80 located outside of the chamber 100. Each magnetron 78 can have a housing 80 to contain a circulating flow of a fluid such as distilled water. The magnetrons 78 are water cooled during the sputtering process to reduce excessive localized heating of the targets 62 and increase target lifespan by pumping distilled water through the housing 80. The exposed portions of the housing 80 of each of the magnetrons 78a-h (which is not in contact with the sputtering member 62) is electrically isolated from the sputtering target 62. The housing 80 contains a set of magnets 82a-c comprising, for example, three rows of magnets, as shown in FIG. 3A. The magnets 82a and 82c are oriented so that their north poles face the sputtering member 64, while the magnet 82b is oriented so that its south pole faces the sputtering member 64. The three rows of magnets 82a-c are permanent magnets which are composed of rare earth magnetic materials, such as for example, neodymium iron boron (NdFeB).

In the version shown in FIG. 3A, the magnetron 78 comprises a housing 80 that is a hollow rectangular casing 83, and the magnets 82a-c are all rectangular magnets arranged in rows 85a-c, respectively, that are mounted in the housing 141. The rectangular magnetron 78 is positioned immediately behind a sputtering member 64 comprising a rectangular plate 65. The rows of magnets 85a-c all extend the length of the housing 80, which in turn extends the length of the rectangular plate 65 of the sputtering member.

In the version shown in FIG. 3B, the sputtering member 64 comprises a cylinder 75 and the housing 80 is also a hollow cylinder 84. The magnets 82a-c are each shaped as a pole 85 that extends the length of the housing 80. In these version, the housing 80 which is a hollow cylinder 84 and the poles 85 constituting the magnets 82a-c are both sized substantially the same size as the sputtering member 64 which is shaped as a cylinder 75 with a length of from about 25 to about 120 cm, for example about 64 cm, a diameter of from about 10 to about 50 am, or even about 12 cm, and a thickness of from about 2 mm to about 15 mm, or even about 6 mm.

Figure 4A:
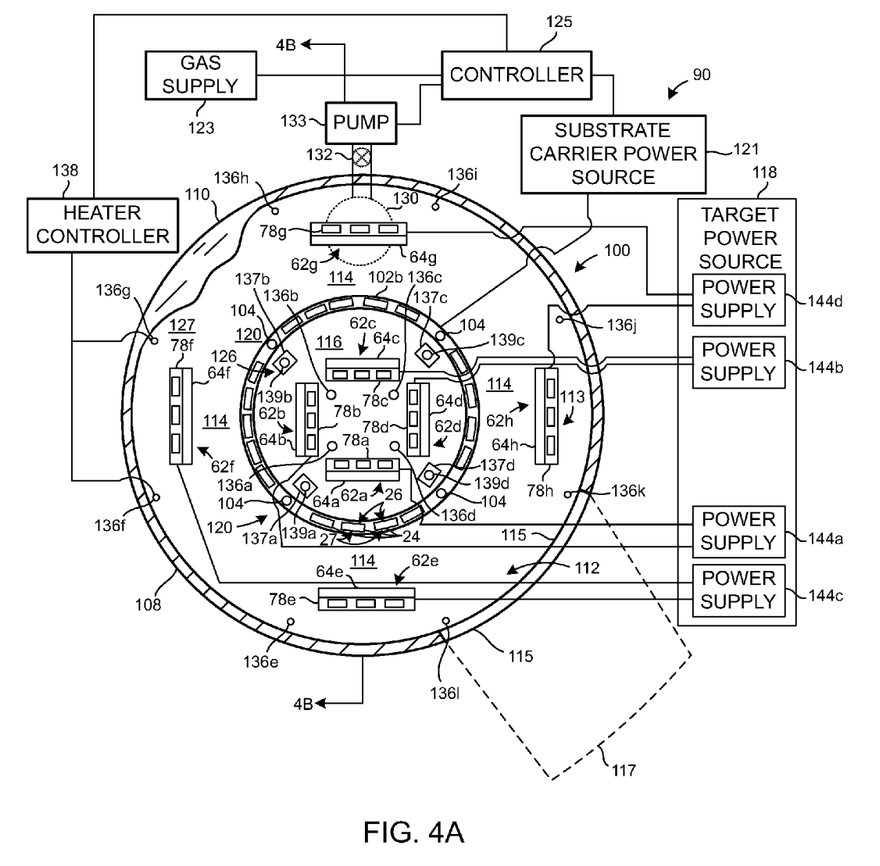
FIG. 4A is a top plan schematic view of an embodiment of a magnetron sputtering chamber.
Figure 4B:
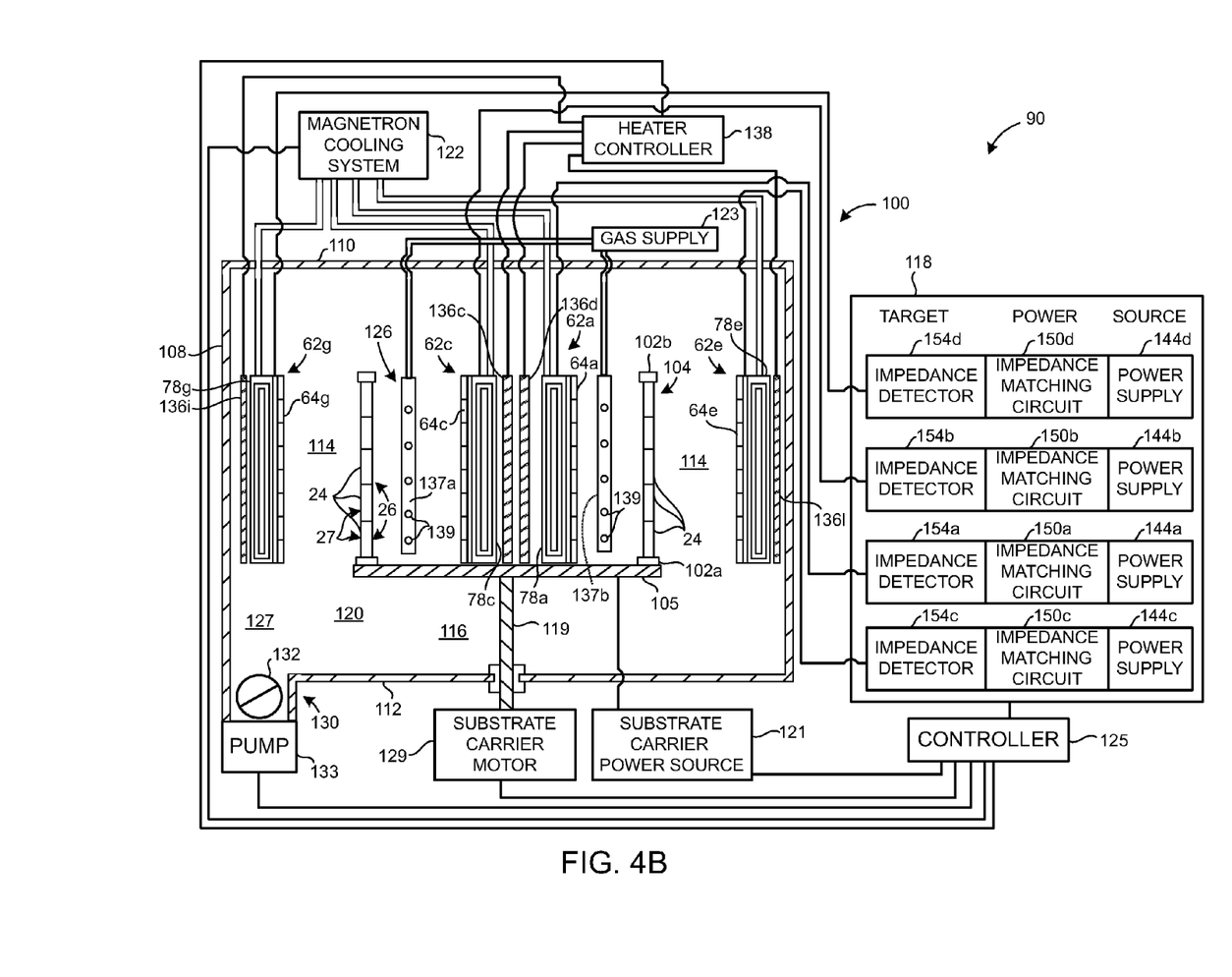
FIG. 4B is a sectional side schematic view of the magnetron sputtering chamber of FIG. 4A as seen from the direction shown by the arrow 4B in FIG. 4A.

In operation, a plurality of selected sputtering targets 62a-d and optionally 62e-h are fastened in an exemplary embodiment of a sputtering chamber 100, as shown in FIGS. 4A and 4B, to deposit lithium-containing films 31 onto a plurality of battery substrates 24 positioned on a substrate carrier 104. The sputtering chamber 100 comprises a circular sidewall 108, a chamber ceiling 110 and a lower wall 112 which surrounds and encloses a plasma zone 114. The chamber sidewall 108 can be electrically isolated from the chamber ceiling 110 and the lower wall 112 and can even be electrically grounded. The chamber sidewalls 108, ceiling 110 and lower wall 112 are typically composed of stainless steel or aluminum.

The sputtering targets 62a-h are electrically coupled to adjacent magnetrons 78a-h. A magnetron cooling system 122 is used to supply distilled or deionized water to the housings 80 of each of the magnetrons to cool the magnets 82a-c in each magnetron 78. A suitable flow rate of cooling water is from about 5 gallon/min to about 25 gallon/min.

In the version shown, the sputtering chamber 100 is joined to a transition mechanism 117 which can be, for example, a chamber, a glove box with controller atmosphere, or a clean room in which a substrate carrier 104 is loaded with a plurality substrates 24. A gate 115, which can be a door or a slit valve, is used for the passage of a substrate carrier 104 from the transition mechanism 117 to the chamber 100 and vice versa. The substrate carrier 104 can be manually transported into the sputtering chamber 100 or transported by a conveyer (not shown). When positioned inside the chamber 100, the substrate carrier 104 holds the substrates 24 so that they are positioned in a circle at a central region 120 of the chamber 100. Further, the substrates 24 are mounted in the substrate carrier 104 so that both the first and second surfaces 26, 27, respectively, of each substrate are exposed to the plasma zone 114 in the chamber 100. For example, the substrates 24 can be vertically mounted in the substrate carrier 104 comprising two open rings 102a,b joined by struts 103 to expose both the first and second surfaces 26, 27. One of the rings 102a can be joined to a disc 105 so that the substrate carrier 104 can be rotated during sputtering in the chamber 100 processing to increase the deposition uniformity of the lithium-containing films 31 sputtered onto the substrates 24. In one version, the substrate carrier 104 is rotated by a substrate carrier motor 129 connected by an axle 119, as shown in FIG. 3B. For example, the substrate carrier 104 can be rotated at a rotational rate of at least about 1 rpm or even from about 0.5 to about 5 rpm.

The substrate carrier 104 can be electrically isolated from the chamber sidewall 108 and the sputtering targets 62, or electrically biased relative to the sidewall 108 or sputtering targets 62. In one version, a substrate carrier power source 121 is connected to the substrate carrier power source 121 to electrically bias the substrate carrier 104 by applying a negative (or positive) voltage relative to the plasma or relative to a time averaged voltage potential applied to the sputtering targets 62. The substrate carrier power source 112 can be a conventional DC power source, pulsed DC power source, or AC power source.

Sputtering gas which can contain non-reacting gases that serve to ionize and sputter material from the sputtering targets 62 and/or reactive gases that react with the sputtered material from the targets 62 is introduced into the chamber 100. The sputtering gases are provided by a gas supply 123 which can include compressed gas cylinders, flow meters, valves, and other flow control equipment. The sputtering gas is introduced via a gas distributor 126 into the chamber 100. In one version, the gas distributor 126 comprises a plurality of tubes 137 with gas holes 139 from which the sputtering gas is passed. The gas exhaust 130 can be used with a throttle valve 132 to control the pressure of the sputtering gas within the chamber 100.

The sputtering chamber 100 can include a heater 136 operated by a heater controller 138 to maintain the substrates 24 at an appropriate processing temperature. For example, the heater 136 can be a plurality of heater rods 135, such as at least 4 rods, or even from about 4 to about 12 rods, distributed across the chamber 100. The heater 136 can also be embedded in the body of the substrate carrier 104 (not shown). The heater 136 is operated by a heater controller 138 located outside the chamber 100, which can include suitable program code, PID controller, thermocouple (one end is located inside the chamber), and heater power supply. In one version, the heater controller 138 is programmed to maintain the substrates 24 are maintained at a temperature of from about 50 to about 300° C. during processing.

In one processing chamber embodiment, a first group of sputtering targets 62*a-d*, which may be selected as described herein or without undergoing the described selection process, is positioned in a radially inward region 116 of the chamber 100. The sputtering targets 62*a-d* are used to sputter material onto the radially interior facing, first or top, surfaces 26 of the substrates when a sputtering plasma is activated in the chamber 100. Since the targets 62*a-d* face the surfaces 26 of each of the substrates 24 they can be used to sputter lithium containing films 31 on these substrate surfaces to form battery cells 22 on one side of the battery substrates 24. Still further, and optionally, a second group of sputtering targets 62*e-h* can be located in a radially outward region 127 of the chamber, when it is desirable to sputter material onto the radially outwardly facing, second or bottom, surfaces 27 of the substrates 24. The first and second groups of the targets 62*a-d* and 62*e-h* can be used individually or together to deposit material on both sides of the substrates. The substrates 24 can also be mounted so that two substrates 24*a,b* are back-to-back so that the targets 62*a-d* deposit lithium-containing films 31 on the exposed surface of the substrate 24*a*, and targets 62*e-h* deposit the lithium-containing film 31 on the exposed surface of the substrate 24*b*. In the example shown, the sputtering targets 62*a-h* each comprise sputtering members 64*a-d* comprising rectangular plates composed of lithium metal oxide, such as $LiCoO_2$. However, sputtering members 64*a-d* comprising the cylinders 75 or other shapes can also be used in the same arrangement and in the same chamber 100. Thus the scope of the present claims should not be limited to rectangular targets or to the particular arrangement of targets depicted.

In the chamber 100, the sputtering targets 62*a-h* are each mounted on the magnetrons 78*a-h*, and the resultant assembly is mounted to the chamber ceiling 110. The sputtering targets 62*a-h* are electrically coupled via the electrically conducting magnetrons 78*a-h* to a target power source 118 that provides an AC (alternating current) voltage to excite the sputtering gas within the chamber 100. The target power source 118 can include one or more power supplies 144*a-d*. In the example shown, the power supplies 144*a-d* are each electrically coupled to a pairs of adjacent sputtering targets 62*a,c* or 62*b,d* or 62*e,f* or 62*g,h* via the attached electrically conducting housing of the magnetrons 78*a-h*, respectively. As one example, when the power supply 144*a* electrically biases the sputtering target 62*a* at a negative potential relative to the sputtering target 62*c*, the sputtering target 62*a* serves as a cathode while the sputtering target 62*c* serves as an anode. During sputtering, the momentary sputtering target 62*a* which operates as a cathode generates secondary electrons which are accelerated towards the target 62*c* which operates as an anode and neutralizes residual positive surface charges which accumulate in electrically insulating or less conductive portions of the sputtering targets 62*a,c* during the negative half cycle.

In one version, the target power source 118 comprising the power supplies 144*a-d* provides an AC voltage at a voltage level of from about 200V and about 1200V, or even from about 250V to about 450V. The voltage is provided at a power level of from about 1 kW and about 20 kW, or even from about 3KW to about 10KW. The voltage is provided in a mid-frequency level of from about 10 to about 100 kHz, or even at a frequency of from about 20 kHz to about 80 kHz. The mid-frequency power reduces, or even eliminates, co-excitation modes that would otherwise occur between the two pairs of adjacent sputtering targets 62*a,c*, etc. Absence of the co-excitation mode results in reduced arcing of the adjacent sputtering targets 62*a,c* (or any of the other pairs of targets 62*b,d*, etc.) thereby increasing the lifespan of the sputtering targets 62, and also improving the quality of the deposited films 31. Arcing is often initiated by electrical breakdown of the insulators electrically isolating the exposed portions of each of the magnetrons 78*a-h*. However, application of a mid-frequency power reduces charging up of the insulating layer covering portions of the magnetrons 78*a-h* and resultant plasma process instabilities. For sputtering targets 62 comprising lithium cobalt oxide, sputtered lithium-containing films 31 can be produced in this manner without arcing over almost the entire lifetime of the targets 62*a-h*. Thus higher power levels can be applied to the sputtering targets 62*a-h* providing a more continuous deposition process without arcing which results in high quality films and higher deposition rates. For example, the mid-frequency dual magnetron process can deposit a homogeneous film at a deposition rate of from about 0.2 to about 4 microns/hour.

In still another aspect of the present invention, one or more impedance matching circuits 150*a,b* are connected between the power supplies 144*a-d* of the target power source 118 and sputtering targets 62, as shown in FIG. 4B. In one version, each impedance matching circuit 150*a-d* is connected to only one of the sputtering targets 62*a-h*. For example, the impedance matching circuit 150a can be connected to only the sputtering target 62a or the sputtering target 62b, or to both of the pair of targets 62a,b. In one example, the impedance matching circuit 150a,b is connected to whichever target 62a or target 62b has a lower impedance. The impedances of each of the targets 62a or 62b of a pair of sputtering targets 62a,b is often slightly different from one another. The impedance difference of each single target 62a or 62b, or the pair of targets 62a,b can cause one of the sputtering targets 62a to be sputtered at a faster rate than the other sputtering target 62b which results in non-uniform thickness or properties of the sputtered film deposited on the battery substrates 24. The impedance matching circuit 150a adjusts the impedance of the target 62a or 62b which has a lower impedance, for example, target 62a, to increase the impedance to substantially match the impedance of the connected target to that of the higher impedance target 62b, to try to equalize the sputtering rates from each of the two targets. For example, the impedance matching circuit 150a can adjust the first impedance of the first target 62a to substantially match the impedance of the higher impedance target 62b, by setting the impedance of the first target 62a to be within a range that is ±10%, or even ±5%, of the second impedance of the second target 62b.

A suitable impedance matching circuit 150a-d comprises an electrical circuit comprising a variable resistor or variable transformer connected in series to a target 62.

For example, the impedance matching circuit 150a comprises an electrical circuit consisting of a variable resistor or variable transformer connected in series to the sputtering target 62a. A suitable variable resistor can have a resistance that varies from about 10 ohm to about 200 ohm. A suitable variable transformer can change the AC voltage delivered to the target by about 10% to 20% in the operating voltage and frequency ranges by, for example, adjusting the turns ratio of the primary and secondary windings. In one example, the impedance detector 154a-d receives a voltage signal and a current signal from a voltage meter and a current meter, or a multimeter, that is electrically connected to a particular target 62a,c,e,g. The voltage and current meters can be connected in parallel and in series, respectively, between individual sputtering targets 62a,c,e,g and the impedance matching circuits 150a,b respectively, as for example shown in FIG. 4B. In this version, the impedance of the sputtering targets 62a,c,e,g is adjusted by adjusting the resistance of the variable resistor and/or the inductance of the variable transformer.

In one version, the impedance matching circuits 150a-d operate by monitoring the power flowing into some or all of the sputtering targets 62a-h, such as for example, the targets 62a,c,e,g as shown, and adjusting the impedance of the connected target 62a,c,e,g relative to the other one of the pair of targets, namely one of sputtering target 62b,d,f,h, respectively, until the power output supplied to the adjacent pairs of targets 62a,b etc., is substantially the same. By substantially the same it is meant that a first power level applied to the first target 62a is within ±10% of a second power level applied to the second target 62b. For example, each impedance matching circuit 150a-d can be electrically connected to an impedance detector 154a-d that is a power detector, and which measures the power delivered to the target 62a,c,e,g to which it is electrically connected. As one example, the impedance matching circuits 150a monitors the electrical power flowing to the sputtering target 62a and adjusts the impedance of the connected target 62a relative to the other sputtering target 62b of the pair of targets 62a,b until the power output supplied to the pair of targets 62a,b is substantially the same, by which it is meant the difference in power output is less than ±10% or even less than ±5%.

In another embodiment, the impedance matching circuits 150a-d operate by measuring the voltage and current of the electrical power applied to the sputtering targets 62a,b, and thereafter, adjusting the impedance of at least one of the pair of sputtering targets 62a,b so that the power supply 144a,b applies a first power level to one of the targets 62a and a second power level to the other target 62b, the first and second power levels being selected in relation to the measured voltage and current. In this manner, the power applied to at least one of the first and second sputtering target is adjusted in relation to the measured voltage and current.

The sputtering chamber 100 can be controlled by a controller 119 that comprises program code to operate components of the chamber 100 to deposit battery component films 30 on a plurality of battery substrates 24 in the chamber 100. In a sputtering process, the sputtering gas mixture is controlled by first evacuating the chamber 100 and then introducing controlled amounts of sputtering gas into the chamber 100 via the gas distributor 126. In one version, the chamber 100 is evacuated to a pressure by the gas exhaust 130 comprising the throttle valve 132 and pump 133 to a pressure of less than about $10 \times 10^{-5}$ Torr, or even less than about $5 \times 10^{-5}$ Torr, or even less than about $2 \times 10^{-5}$ Torr, prior to introduction of sputtering gas. Thereafter, a pre-sputtering step can be used to clean residues from the sputtering targets 62a-h and from the inner surfaces of the chamber 100. The pre-sputtering process is conducted by providing a sputtering gas comprising an inert gas to the chamber 100 via the gas distributor 126 with a controlled flow rate and pressure. For example, a sputtering gas consisting of argon can be provided at a flow rate of about 300±20 sccm and maintained at a pressure of about 10±0.2 mTorr. The power supplies 144a-d of the target power source 118 are set by the controller to apply power of from about 1 to about 10 KW to adjacent pairs of the sputtering targets 62a-h to pre-sputter the targets for a sufficient time of about 5 minutes to 20 minutes to clean the surface of the sputtering targets 62a-h.

After cleaning, a substrate carrier 104 is transported into the sputtering chamber 102, electrically isolated from the chamber wall 108, and the substrate carrier power source 121 is powered on to bias the carrier 104 and the substrates 24 held therein. In one version, the substrates 24 can include from 100 to 1000 substrates that are each comprise a sheet of mica sized with an area of from about 5 cm² to about 50 cm². In an exemplary process, the substrate carrier power source 121 maintains the substrate carrier 104 at a negative pulsed DC bias voltage or AC voltage relative to an inner region of the chamber wall 108, of from about −5 V to about −200V, or even from about −5 V to about −100 V, or even about −40 V. The pulsed biasing voltage has a duty cycle of from about 10% to about 90%, or even about 30%. Alternatively, the DC bias voltage can be a floating potential of the substrate carrier 104 in the plasma. The electrically isolated or negatively biased substrate carrier 104 attracts positively charged ions when a plasma is formed in the plasma zone 114 to deposit a sputtered film having a higher quality microstructure onto the battery substrates 24. The substrates 24 are maintained at a temperature of from about 50 to about 300° C. during processing by operating the heater controller 138 which powers the heaters 136a-l.

A magnetron sputtering process is then conducted to deposit lithium-containing films 31 comprising lithium cobalt oxide on the battery substrates 24 at deposition rates of from about 0.2 to about 4 microns/hr. The chamber 100 is pumped down to below 5×10⁻⁵ Torr. Sputtering gas, such as for example, at least one of argon or oxygen or even a mixture of argon and oxygen, is introduced into the chamber 100 from the gas supply 123 via the gas distributor 126. In one version, the exhaust system 130 is used to maintain the sputtering gas at a partial pressure from about 3 to about 20 mTorr, or even about 5 to 10 mTorr; and the oxygen is maintained at a partial pressure of from about 0.1 to about 5 mTorr, or even about 0.5 to 1 m Torr. The magnetron cooling system 122 is then used to supply distilled or deionized water to the individual housings 80 of each of the magnetrons 78 to cool the magnets 82*a-c* and the sputtering targets 62 therein. The power supplies 144*a-d* provide an AC voltage at a mid-frequency power to the targets 62*a-d* and/or the targets 62*e-h*, respectively, at a power density of from about 0.1 to about 20 W/cm². The sputtering process conditions are maintained for from about 2 to about 30 hours, for example, about 15 hours, to deposit on the substrates 24, lithium-containing films 31 comprising lithium cobalt oxide having a thickness of from about 5 μm to about 50 μm.

After deposition is complete, the substrate carrier 104 is moved into the transition mechanism 117 and the slit valve 115 closed. The transition mechanism 117 which can be, for example, a chamber, a glove box with controller atmosphere, or a clean room in which a substrate carrier 104 is loaded with a plurality substrates 24. A gate 115 is used to open the transition mechanism 117 to insert the loaded substrate carrier 104 from the outside environment. The transition mechanism 117 is vented and the substrate carrier 104 removed. The substrates 24 can now be removed from the substrate carrier 104 and other battery component films 30 of battery cells 22 formed on each of the substrates 24 as needed.

Figure 5A:
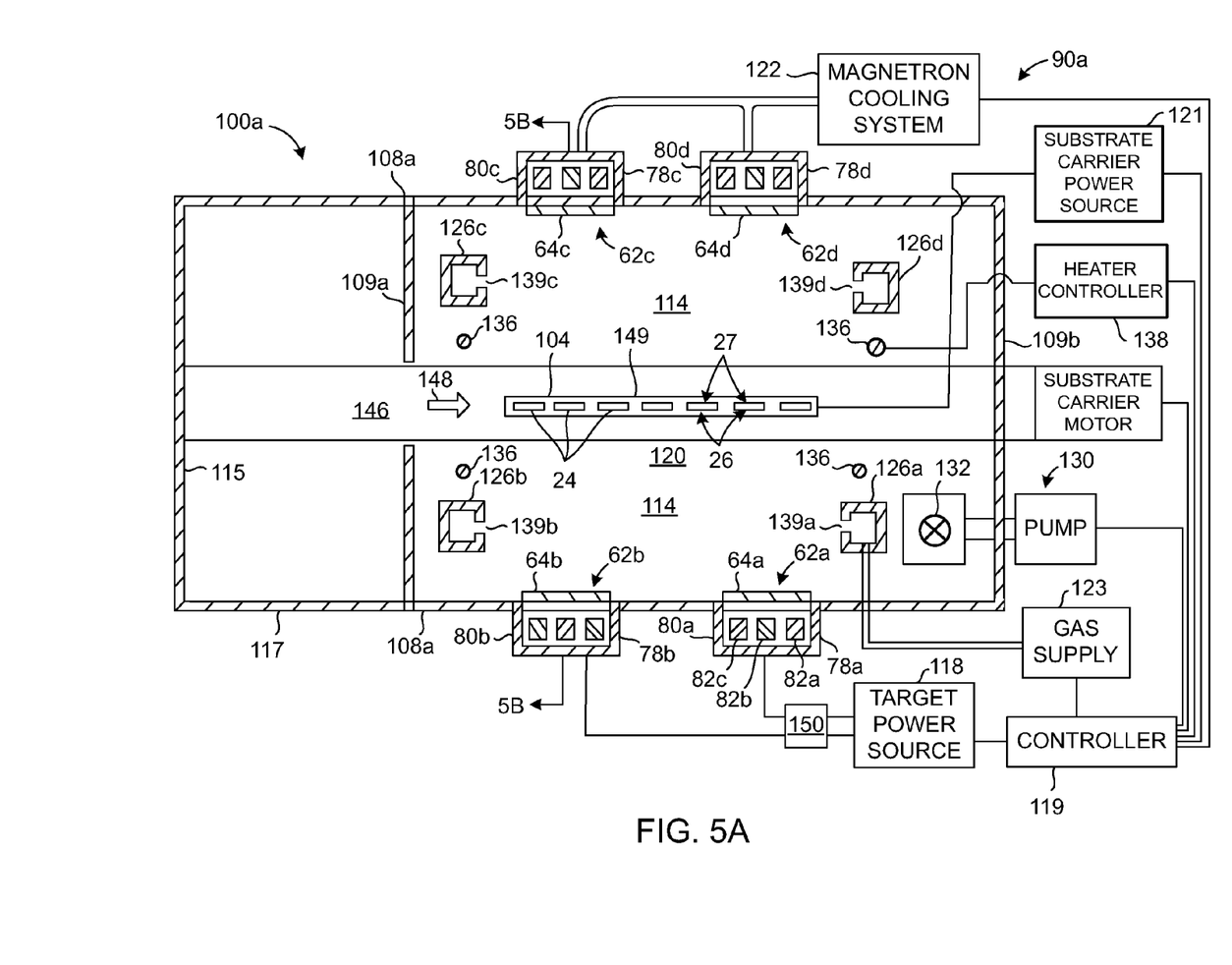
FIG. 5A is a top plan schematic view of another embodiment of a magnetron sputtering chamber.
Figure 5B:
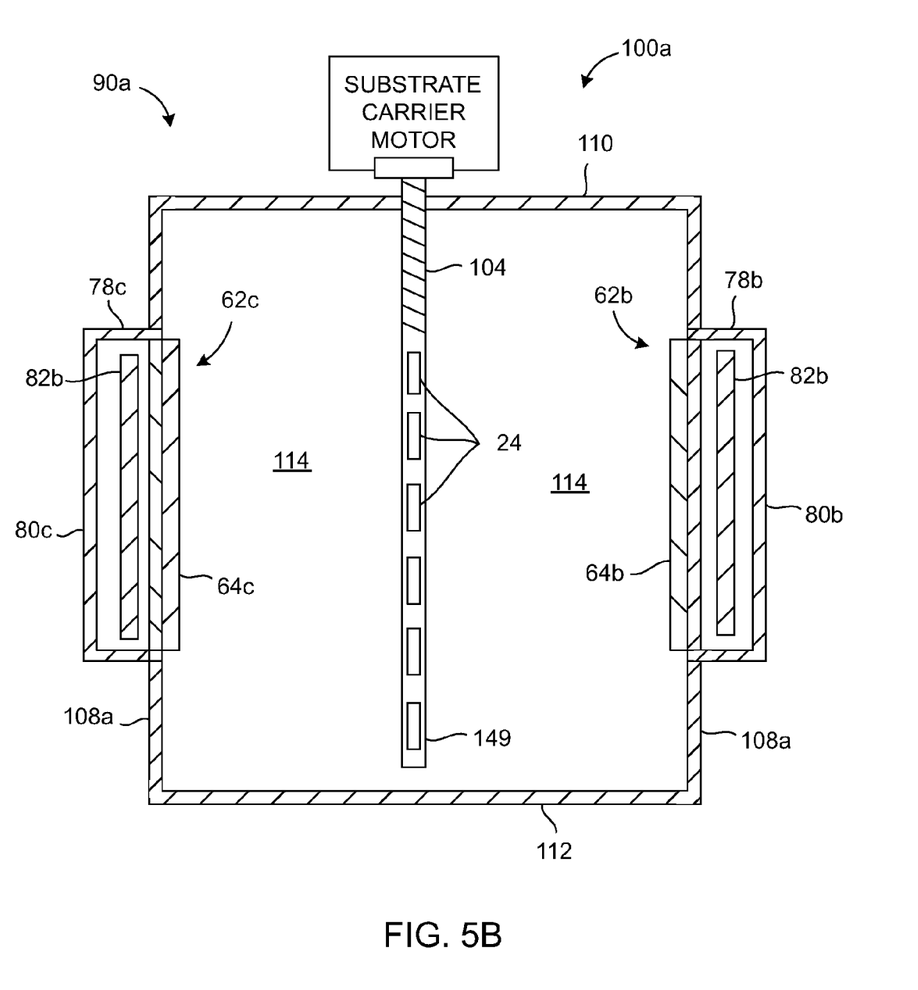
FIG. 5B is a sectional side schematic view of the magnetron sputtering chamber of FIG. 5A as seen from the direction shown by the arrow 5B in FIG. 5A.

Another version of a sputtering chamber 100*a* capable of depositing lithium-containing films 31 onto a plurality of battery substrates 24 is shown in FIGS. 5A and 5B. This sputtering chamber 100*a* comprises a rectangular sidewall 108*a*, endwall 109*a,b*, chamber ceiling 110 and lower wall 112, which surrounds and encloses a plasma zone 114. The chamber sidewalls 108*a*, ceiling 110 and lower wall 112 are typically composed of stainless steel or aluminum. A plurality of selected sputtering targets 62*a-d* are electrically coupled to adjacent magnetrons 78*a-d* in the chamber 100*a*, and a magnetron cooling system 122 is used to supply distilled or deionized water to the housings 80*a-d* of each of the magnetrons 78*a-d* to cool the magnets 82*a-c* and the targets 62*a-d* in each magnetron 78*a-d*.

The substrate carrier 104 is transported by a conveyer 146 in the direction shown by the arrow 148 into, and slowly across, a central region 120 of the chamber 100*a*. The substrates 24 are mounted in the substrate carrier 104 so that both the first and second surfaces 26, 27, respectively, of each substrate are exposed to the plasma zone 114 in the chamber 100*a*. For example, the substrate carrier 104 can comprise an open frame 149 which mounts the substrates 24 to expose both the first and second surfaces 26, 27 of each of the substrates 24. The conveyor 146 moves the substrate carrier 104 across the chamber past the sputtering targets 62*a-d* during deposition to cause an even thickness of sputtered material to be deposited on the both sides 26, 27 of the substrates 24. For example, the substrate carrier 104 can be moved across the chamber 102*a* at a linear rate of at least about 5 cm/min or even from about 5 to about 50 cm/min. The substrate carrier 104 can be electrically isolated from the chamber sidewall 108*a* and the sputtering targets 62, or electrically biased relative to the sidewall 108*a* or sputtering targets 62 by a substrate carrier power source 121 which applies a negative (or positive) voltage to the carrier 104 relative to the plasma or relative to a time averaged voltage potential applied to the sputtering targets 62, as previously described.

Sputtering gas which can contain non-reacting gases that serve to sputter material from the sputtering targets 62 and/or reactive gases that react with the sputtered material from the targets 62 is introduced into the chamber 100*a* by a gas supply 123 which can include compressed gas cylinders, flow meters, valves, and other flow control equipment. The sputtering gas is introduced via the gas distributors 126*a-d* into the chamber 100*a*, each of which comprises gas holes 139*a-d* from which the sputtering gas is passed. A gas exhaust 130 comprising a vacuum pump 133 can be used with a throttle valve 132 to control the pressure of the sputtering gas within the chamber 100*a*. A heater 136 operated by a heater controller 138 maintains the substrates 24 at an appropriate processing temperature. For example, the heater 136 can be a plurality of heater rods, such as at least 4 rods, or even from about 4 to about 12 rods, distributed across the chamber 100*a*.

In the example shown, the sputtering targets 62*a-d* each comprise sputtering members 64*a-d* comprising rectangular plates composed of LiCoO₂. However, sputtering members 64*a-d* comprising the cylinders 75 or other shapes can also be used in the same arrangement and in the same chamber 100*a*. Thus the scope of the present claims should not be limited to rectangular targets or to the particular arrangement of targets depicted. The targets 62*a-d* are each mounted on the magnetrons 78*a-d*, and the resultant assembly is mounted to the chamber ceiling 110. The sputtering targets 62*a-d* are electrically coupled via the electrically conducting magnetrons 78*a-d* to a target power source 118 that provides an AC (alternating current) voltage to excite the sputtering gas within the chamber 100*a*. The target power source 118 can include one or more power supplies (not shown) that are each electrically coupled to a pairs of adjacent sputtering targets 62*a,b* or 62*c,d* via the attached electrically conducting housing of the magnetrons 78*a-d*, respectively, and operate as previously described. In one version, the target power source 118 provides an AC voltage at a voltage level of from about 200 V and about 1200 V, or even from about 250 V to about 500 V; at a power level of from about 1 kW and about 20 kW, or even from about 3 kW to about 10 kW; and at a mid-frequency level of from about 10 to about 100a kHz.

As explained herein, one or more impedance matching circuits 150 are connected between the target power source 118 and sputtering targets 62*a-d*, to adjust the impedance of whichever sputtering target 62*a* through 62*d*, which has lower impedance relative to its partner paired target. The impedance matching circuit 150 adjusts the first impedance of the first target 62*a* to substantially match the impedance of the higher impedance target 62*b*, by setting the impedance of the first target 62*a* to be within a range that is ±10%, or even ±5%, of the second impedance of the second target 62*b*. The impedance matching circuit 150 can operate by monitoring the power flowing into some or all of the sputtering targets 62*a-d* using an impedance detector 154 that measures the impedance of the target 62*a-d* to which it is electrically connected.

The sputtering chamber 100*a* can be controlled by a controller 119 that comprises program code to operate components of the chamber 100*a* to deposit battery component films 30 on a plurality of battery substrates 24 in the chamber 100*a*. In a sputtering process, the sputtering gas mixture is controlled by first evacuating the chamber 100*a* and then introducing controlled amounts of sputtering gas, such as for example, a mixture of argon and oxygen, from the gas supply 123 via the gas distributor 126. In one version, the exhaust system 130 is used to maintain the sputtering gas is maintained at a partial pressure from about partial pressure from about 3 to about 20 mTorr, or even about 5 to 10 mTorr; and the oxygen is maintained at a partial pressure of from about 0.1 to about 5 mTorr, or even about 0.5 to 1 m Torr.

The magnetron cooling system 122 is then used to supply distilled or deionized water to the individual housings 80a-d of each of the magnetrons 78a-d to cool the magnets 82a-c therein. The target power source 118 provides an AC voltage at a mid-frequency power to the targets 62a-d respectively, at a power density of from about 0.1 to about 20 W/cm². The sputtering process conditions are maintained for from about 2 to about 10 minutes, for example, about 6 minutes. After deposition is complete, the substrate carrier 104 is moved back to the transition mechanism 117, which is then vented, and the substrate carrier 104 thereafter removed. The substrates 24 can now be removed from the substrate carrier 104 and battery cells 22 formed on each of further processed as needed.

The fabrication process described herein can include processes of forming a battery cell 22 and batteries 20 which are found in, for example, commonly assigned U.S. patent application Ser. No. 12/032,997, entitled "LITHIUM BATTERY FABRICATION USING LASER SHAPING" to Nieh et al., filed on Feb. 18, 2008; and U.S. Pat. No. 6,921,464; U.S. Pat. No. 6,632,563, U.S. Pat. No. 6,863,699, and U.S. Pat. No. 7,186,479; all of which are incorporated by reference herein and in their entireties.

While particular sputtering targets, process steps and process sequences, and chamber configurations are described herein to illustrate embodiments of the present process, it should be understood that other targets, target shapes, processes or sequences of process steps, and configurations of the sputtering chamber 100 can also be used as would be apparent to one of ordinary skill in the art. For example, the sputtering targets 62 can have different shapes and structures, and the voltages and power levels applied to the targets 62 or substrates 24 can be different ones. Also, other configurations of the chamber 100 are possible for example the chamber can have additional targets 62, different power sources, or other features. Therefore, the spirit and scope of the appended claims should not be limited to the description of the preferred versions contained herein

What is claimed is:

1. A method of depositing a lithium-containing film on a battery substrate in a sputtering chamber, the method comprising:
   (a) measuring an electrical conductivity at multiple points across a surface of each sputtering target of a plurality of sputtering targets, the sputtering targets comprising (i) a front surface of a sputtering member composed of lithium cobalt oxide or lithium nickel cobalt oxide, and (ii) a back surface, wherein the electrical conductivity measurements are made across the front and back surfaces by two probe or four-point-probe tests, and selecting at least one pair of sputtering targets (i) that each comprise an average electrical conductivity of at least about $5 \times 10^{-6}$ S·cm$^{-1}$ and (ii) such that the average electrical conductivity of each of the pair of sputtering targets varies from one another by less than about 10%;
   (b) providing in the sputtering chamber, the at least one pair of selected sputtering targets and a substrate carrier holding at least one battery substrate;
   (c) maintaining a pressure of a sputtering gas in the sputtering chamber; and
   (d) energizing the sputtering gas by applying to the pair of sputtering targets, an AC electrical power at a frequency of from about 10 to about 100 kHz.

2. A method according to claim 1 wherein each sputtering target comprises a backing plate, and wherein the back surface of the sputtering target comprises the back surface of the backing plate or a back surface of the sputtering member.

3. A method according to claim 1 wherein (a) comprises selecting sputtering targets that each have electrical conductivity values, as measured at different points on their surfaces, that vary from one another by less than about ±10%.

4. A method according to claim 1 wherein (b) comprises applying to the substrate carrier, a negative pulsed DC bias voltage comprising at least one of the following:
   (i) a voltage level of from about −5 V to about −200 V; and
   (ii) a duty cycle from about 10% to about 90%.

5. A method according to claim 1 wherein the sputtering gas comprises at least one of argon or oxygen.

6. A method according to claim 1 further comprising before (a) or after (d), depositing a plurality of battery component films that cooperate to form a battery, the battery component films comprising at least a pair of electrodes and an electrolyte, and wherein the deposited lithium-containing film serves as an electrode.

7. A method according to claim 1 wherein the pair of selected sputtering targets are connected to a power supply and at least one sputtering target is connected to an impedance matching circuit, and wherein during (d), the impedance matching circuit adjusts the impedance of one of the pair of sputtering targets to be within a range that is ±10% of the impedance of the other sputtering target.

8. A method according to claim 1 comprising selecting a pair of sputtering targets such that the sputtering targets each have an average electrical conductivity of from about $5 \times 10^{-6}$ S·cm$^{-1}$ to about $5 \times 10^{-5}$ S·cm$^{-1}$.

9. A method of depositing a lithium-containing film on a battery substrate in a sputtering chamber, the method comprising:
   (a) measuring an electrical conductivity at multiple points across a surface of each sputtering target of a group of sputtering targets, the sputtering targets comprising (i) a front surface of a sputtering member composed of lithium cobalt oxide or lithium nickel cobalt oxide, and (ii) a back surface, wherein the electrical conductivity measurements are made across the front and back surfaces by two probe or four-point-probe tests, and selecting first and second sputtering targets (i) that each comprise an average electrical conductivity of at least about $5 \times 10^{-6}$ S·cm$^{-1}$ and (ii) such that the average electrical conductivity of the first and second sputtering targets varies from one another by less than about 10%;
   (b) providing in the sputtering chamber, (i) the selected first and second sputtering targets connected to a power supply with at least one of the first and second sputtering targets also connected to an impedance matching circuit, and (ii) a substrate carrier holding at least one battery substrate;
   (c) maintaining a pressure of a sputtering gas in the sputtering chamber;
   (d) adjusting the impedance of the first or second sputtering target with the impedance matching circuit such that the impedance of the first target is within a range that is ±10% of the impedance of the second sputtering target; and
   (e) energizing the sputtering gas by applying to the first and second sputtering targets, an AC electrical power at a frequency of from about 10 to about 100 kHz.

10. A method according to claim 9 wherein (d) comprises adjusting the impedance of the first sputtering target to be within a range that is ±5% of impedance of the second sputtering target.

11. A method according to claim 9 wherein (d) comprises measuring the voltage and current of the electrical power applied to the first and second sputtering targets, and adjusting the impedance of at least one of the first and second sputtering targets in relation to the measured voltage and current.

12. A method according to claim 11 wherein (d) comprises adjusting the impedance of at least one of the first and second sputtering targets so that the power supply applies a first power level to the first sputtering target and a second power level to the second sputtering target, the first and second power levels being selected in relation to the measured voltage and current.

13. A method according to claim 9 wherein (a) comprises selecting first and second sputtering targets that each have electrical conductivity values, as measured at different points on their surfaces, which vary from one another by less than about ±10%.

14. A method according to claim 9 comprising selecting the first and second sputtering targets such that sputtering targets each have an average electrical conductivity of from about $5 \times 10^{-6}$ S·cm$^{-1}$ to about $5 \times 10^{-5}$ S·cm$^{-1}$.

15. A method according to claim 9 wherein each sputtering target comprises a backing plate, and wherein the back surface of the sputtering target comprises the back surface of the backing plate or a back surface of the sputtering member.

16. A method of depositing a lithium-containing film on a battery substrate in a sputtering chamber, the method comprising:
  (a) measuring an electrical conductivity at multiple points across a surface of each sputtering target of a group of sputtering targets, the sputtering targets comprising (i) a front surface of a sputtering member composed of lithium cobalt oxide or lithium nickel cobalt oxide, and (ii) a back surface, wherein the electrical conductivity measurements are made across the front and back surfaces by two probe or four-point-probe tests, and selecting at least one pair of sputtering targets (i) that each have an average electrical conductivity of at least about $5 \times 10^{-6}$ S·cm$^{-1}$, and (ii) such that the average electrical conductivity of each of the pair of sputtering targets varies from one another by less than about 10%;
  (b) providing in the sputtering chamber, the at least one pair of selected sputtering targets and a substrate carrier holding at least one battery substrate;
  (c) maintaining a pressure of a sputtering gas in the sputtering chamber; and
  (d) energizing the sputtering gas by applying to the pair of sputtering targets, an electrical power comprising AC power at a frequency of from about 10 to about 100 kHz.

17. A method according to claim 16 wherein each sputtering target comprises a backing plate, and wherein the back surface of the sputtering target comprises a back surface of the backing plate or a back surface of the sputtering member.

18. A method according to claim 16 wherein (b) comprises applying to the substrate carrier, a negative pulsed DC bias voltage comprising at least one of the following:
  (i) a voltage level of from about −5 V to about −200 V; and
  (ii) a duty cycle from about 10% to about 90%.

19. A method according to claim 16 wherein the pair of sputtering targets are connected to a power supply and at least one sputtering target is connected to an impedance matching circuit, and wherein during (d), the impedance matching circuit adjusts the impedance of one of the pair of sputtering targets to be within a range that is ±10% of the impedance of the other sputtering target.

20. A method according to claim 16 comprising selecting a pair of sputtering targets such that the sputtering targets each have an average electrical conductivity of from about $5 \times 10^{-6}$ S·cm$^{-1}$ to about $5 \times 10^{-5}$ S·cm$^{-1}$.

21. A method according to claim 16 wherein (a) comprises selecting a pair of sputtering targets that each have electrical conductivity values, as measured at different points on their surfaces, which vary from one another by less than about ±10%.

* * * * *